US007940941B2

(12) United States Patent
Akiyama et al.

(10) Patent No.: US 7,940,941 B2
(45) Date of Patent: May 10, 2011

(54) EFFECT ADDING METHOD AND EFFECT ADDING APPARATUS

(75) Inventors: Hitoshi Akiyama, Hamamatsu (JP); Ryotaro Aoki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1169 days.

(21) Appl. No.: 11/644,961

(22) Filed: Dec. 26, 2006

(65) Prior Publication Data

US 2007/0160231 A1 Jul. 12, 2007

(30) Foreign Application Priority Data

Dec. 27, 2005 (JP) ................................ 2005-376400

(51) Int. Cl.
*H03G 5/00* (2006.01)

(52) U.S. Cl. ............................... 381/98; 381/28; 381/61

(58) Field of Classification Search .................... 381/98, 381/61, 28
See application file for complete search history.

(56) References Cited

U.S. PATENT DOCUMENTS 4,295,106 A 10/1981 Kahn
4,700,390 A * 10/1987 Machida ...................... 704/500

FOREIGN PATENT DOCUMENTS

EP 1 492 081 A1 12/2004
JP 3137289 B2 12/1990

OTHER PUBLICATIONS

European Search Report dated May 11, 2007 (Five (5) pages).

* cited by examiner

*Primary Examiner* — Xu Mei
*Assistant Examiner* — Paul Kim
(74) *Attorney, Agent, or Firm* — Crowell & Moring LLP

(57) ABSTRACT

An effect adding method, includes: applying different gains to a positive side waveform portion and a negative side waveform portion of an audio signal respectively when absolute values of input levels of the positive side waveform portion and the negative side waveform portion are smaller than a predetermined value; producing a higher range component of the audio signal based on a high range component of the audio signal to which the gain is applied, the higher range component being higher in frequency than the high range component; producing a lower range component of the audio signal based on a low range component of the audio signal to which the gain is applied, the lower range component being lower in the frequency than the low range component; and synthesizing an audio signal having an effect sound by adding the audio signal to which the different gains are applied, the higher range component, and the lower range component with each other.

9 Claims, 10 Drawing Sheets

EFFECT ADDING METHOD AND EFFECT ADDING APPARATUS

BACKGROUND OF THE INVENTION

The present invention relates to an effect adding method and an effect adding apparatus, which are capable of emphasizing rich sounds, extension and gorgeousness of a high tone range, and powerful feelings of low tones in audio reproducing operations. More specifically, the present invention relates to such effect adding method and apparatus, which are applied to a reproducing operation of sound sources having high compression ratios so as to achieve an excellent sound effect.

Generally speaking, in compressed audio format sound sources known as MP3 (MPEG-1 Audio Layer III), AAC (Advanced Audio Coding of MPEG-2/4 Audio), and the like, components in a high tone range and such components which can be hardly heard in view of an acoustic psychological aspect are removed away during encoding operation in order to realize a high compression ratio. For instance, in the case of MP3, signal components higher than, or equal to 16 KHz are cut when the most utilized compression ratio (128 Kbps) is selected. As a result, sounds of compressed sound sources may be heard as follows: That is, sounds in high tone ranges may be heard as dull or dim sounds, or may be heard as lean sounds without dynamism and vitality in an entire component.

Recently, as technical ideas for reinforcing high tone ranges when sound sources such as CDs whose ranges have been limited are played back, there is a technical idea described in Japanese Patent No. 3137289 (FIG. 1). This technical idea is made as follows: That is, higher harmonic components of a sound source are produced based upon the sound source whose range has been limited, the produced higher harmonic components are added to the sound source whose range has been limited, and the resulting sound source is played back, so that the sounds in the sound ranges covering such a sound range higher than that of the sound source whose range has been limited can be played back.

However, as to the sound sources such as MP3 and AAC having the high compression ratios, the rich sounds and the dynamism and vitality of low tones cannot be obtained by merely reinforcing the above-explained high tone range, so that the effect for improving the sound qualities is still insufficient.

SUMMARY OF THE INVENTION

The present invention has been made to solve the problem occurred in the above-explained related technical ideas, and therefore, has an object to provide an effect adding method and an effect adding apparatus, which are capable of emphasizing rich sounds, extension and gorgeousness of the high tone range, and also dynamism and vitality of low tones in audio reproducing operations.

In order to achieve the above object, according to the present invention, there is provided an effect adding method, comprising:

applying different gains to a positive side waveform portion and a negative side waveform portion of an audio signal respectively when absolute values of input levels of the positive side waveform portion and the negative side waveform portion are smaller than a predetermined value, producing a higher range component of the audio signal based on a high range component of the audio signal to which the gain is applied, the higher range component being higher in frequency than the high range component;

producing a lower range component of the audio signal based on a low range component of the audio signal to which the gain is applied, the lower range component being lower in the frequency than the low range component; and synthesizing an audio signal having an effect sound by adding the audio signal to which the different gains are applied, the higher range component, and the lower range component with each other.

Preferably, when the absolute values of the input levels of the positive side waveform portion and the negative side waveform portion are larger than the predetermined value, a common gain is applied to the positive side waveform portion and the negative side waveform portion respectively in the applying process.

In accordance with the effect applying method of the present invention, since the different gains from each other are applied with respect to the positive side waveform portion and the negative side waveform portion of the audio signal in response to the absolute values of the input levels thereof, even-order harmonics (harmonics) which are generated in positive/negative asymmetrical waveforms are contained in the audio signal. The even-order higher harmonics may constitute factors for causing that sounds of vacuum tube amplifiers may produce rich sounds, for example, mild feelings with pleasant feelings, warm feelings, mellow sounds, and the like. As a result, since the gains are applied to the audio signal, the audio signal may be enriched. Moreover, the gains to be applied to the positive side waveform portion and the negative side waveform portion are made different from each other only when the input level is smaller than the predetermined value, whereas when the input level is larger than the predetermined value, the common gain is applied to both the positive side waveform portion and the negative side waveform portion. As a result, it is possible to avoid excessive rich sounds from the effect.

Also, in accordance with the effect applying method of the present invention, the higher range component of the audio signal is formed based upon the high range component of the audio signal to which the gain has been applied, while the higher range component is higher in frequency than the high range component. As a result, the extension of the high range and the gorgeousness thereof can be emphasized. Furthermore, lower range component of the audio signal is formed based upon the low range component of the audio signal to which the gain has been applied, while the lower range component is lower in the frequency than the low range component. As a result, dynamism and vitality of low tones can be emphasized. As a consequence, in accordance with the effect applying method of the present invention, if this effect applying method is applied in order to reproduce the sound sources having the high compression ratios such as MP3 and AAC, then the following sounds can be improved. That is, the high tone range is heard as dull or dim sounds, and also, as lean sounds without dynamism and vitality in the entire sound portion.

While the process operations for forming the higher range component and the lower range component of the audio signal were carried out respectively based upon the sound source before the gains were applied, in the case that the higher range component and the lower range component of the audio signal formed by executing the above-explained process operations are added and synthesized with the gain-applied sound, an acoustic unity sense could not be achieved between the rich-applied sounds obtained by being applied by the gain, and the sounds in the higher range component and the lower range component, which are formed based upon the sound sources before the gain was applied. To the contrary, as explained in the present invention, the sounds of the higher range component and the lower range component are formed based upon the rich-applied sound achieved by being applied by the gain, and then, are added/synthesized with the rich-applied sound, the acoustic unity sense of sounds could be obtained.

The above-explained gain applying process operation may be alternatively carried out as follows: That is to say, for example, the above-explained audio signal may be separated into a positive side waveform portion and a negative side waveform portion; gain applying process operations may be separately carried out with respect to the positive side waveform portion and the negative side waveform portion; and then, the gain-applied positive side waveform portion may be added/synthesized by the gain-applied negative side waveform portion.

In the effect applying method of the present invention, the gain with respect to the positive side waveform portion is applied to the absolute value of the input level of the positive side waveform portion which is processed by relaxing a falling portion of an input waveform of the positive side waveform portion by a predetermined release time. The gain with respect to the negative side waveform portion is applied to the absolute value of the input level of the negative side waveform portion which is processed by relaxing a falling portion of an input waveform of the negative side waveform portion by the predetermined release time. As a result, it is possible to suppress that the gain is frequently changed in the case that the level and the frequency of the input signal are relatively high, and therefore, it is possible to avoid reproductions of unnatural sounds or sounds with distortion feelings.

Preferably, an input/output level characteristic of one of the positive side and negative side waveform portions with respect to the gain includes: a high level-side linear area in which the level characteristic is formed so that an output level is changed in a linear manner with respect to the input level when the absolute value of the input level is larger than the predetermined value; and a low level-side non-linear area in which the level characteristic is formed so that the output level is changed in a non-linear manner with respect to the input level when the absolute value of the input level is smaller than or equal to the predetermined value while being continued to an edge portion of the level characteristic in the high level-side linear area, and is formed so that the output level is not lowered to zero when the input level is zero. The input/output level characteristic of the other of the positive side and negative side waveform portions with respect to the gain includes: a high level-side linear area in which the level characteristic is same as the level characteristic in the high level-side liner area with respect to the one of the positive side and negative side waveform portions; and a low level-side non-linear area in which the level characteristic is formed so that the output level is changed in the non-linear manner with respect to the input level when the absolute value of the input level is smaller than or equal to the predetermined value while being continued to the edge portion of the level characteristic in the high level-side linear area, and is formed so that the output level is kept zero when the input level is in a range from zero to a predetermined level.

Preferably, in the producing process of the higher range component of the audio signal, the high range component of the audio signal to which the gain is applied is extracted, the extracted high range portion is multiplied by a sine wave signal having a predetermined frequency, and within a low range-side shift component and a high range-side shift component, which are produced by the multiplication, the low range-side shift component is removed so as to obtain the remaining high range-side shift component as the higher range component of the audio signal.

In accordance with this effect applying method, the frequency of the high range portion of the audio signal is merely shifted, but the higher harmonic components of this high range component are not produced. As a result, such a signal of the high range containing a small amount of extra distortion components such as so-called “aliasing” may be produced.

The producing process of the lower range component, may be carried out as follows. That is, for example, zero crosses of the audio signal to which the gain has been applied may be detected, while 4 continued sections sectioned by these detected zero crosses are defined as 1 unit, polarities of waveforms as to the 2 continued sections may be inverted, and this inverting process operation may be repeatedly carried out for every 1 unit so as to form such a signal having a ½ time period as to the time period of the basic wave component of the above-described low area component. In addition, both harmonic components and ultra low range components may be removed which are produced by the above-explained inverting process operation.

Preferably, the effect adding method further includes: compressing a high level portion of the higher range component relative to low and medium level portions of the higher range component so as to relatively increase signal levels of the low and medium level portions with respect to that of the high level portion after the producing process of the higher range component; and compressing a high level portion of the lower range component relative to low and medium level portions of the lower range component so as to relatively increase signal levels of the low and medium level portions with respect to that of the high level portion after the producing process of the lower range component. In the synthesizing process of the audio signal, the compressed higher range component and the compressed lower range component are added to the audio signal to which the gain is applied. As a consequence, the low and medium level portions of the audio signal may be emphasized, so that the effects (extension and gorgeousness of high range, and dynamism and vitality of low tones) for adding the higher range component and the lower range component may be emphasized.

Preferably, in the synthesizing process of the audio signal, the audio signal to which the different gains are applied, the higher range component, and the lower range component are added to each other after time sequences of the audio signal, the higher range component, and the lower range component are adjusted. As a result, the timing when the sounds produced by these 3 signal components are reached to a listener may be shifted from each other (namely, timing is mutually shifted among 3 signal components, or between 1 signal component and 2 other signal components), so that a sound quality tendency may be changed.

According to the present invention, there is also provided an effect adding apparatus comprising:

a gain applying unit that applies different gains to a positive side waveform portion and a negative side waveform portion of an audio signal respectively when absolute values of input levels of the positive side waveform portion and the negative side waveform portion are smaller than or equal to a predetermined value, a first producing unit that produces a higher range component of the audio signal based on a high range component of the audio signal to which the gain is applied, the higher range component being higher in frequency than the high range component;

a second producing unit that produces a lower range component of the audio signal based on a low range component of the audio signal to which the gain is applied, the lower range component being lower in the frequency than the low range component; and a synthesizing unit that synthesizes an audio signal having an effect sound by adding the audio signal to which the different gains are applied, the higher range component, and the lower range component with each other.

Preferably, when the absolute values of the input levels of the positive side waveform portion and the negative side waveform portion are larger than the predetermined value, the gain applying unit applies a common gain to the positive side waveform portion and the negative side waveform portion respectively in the applying process.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
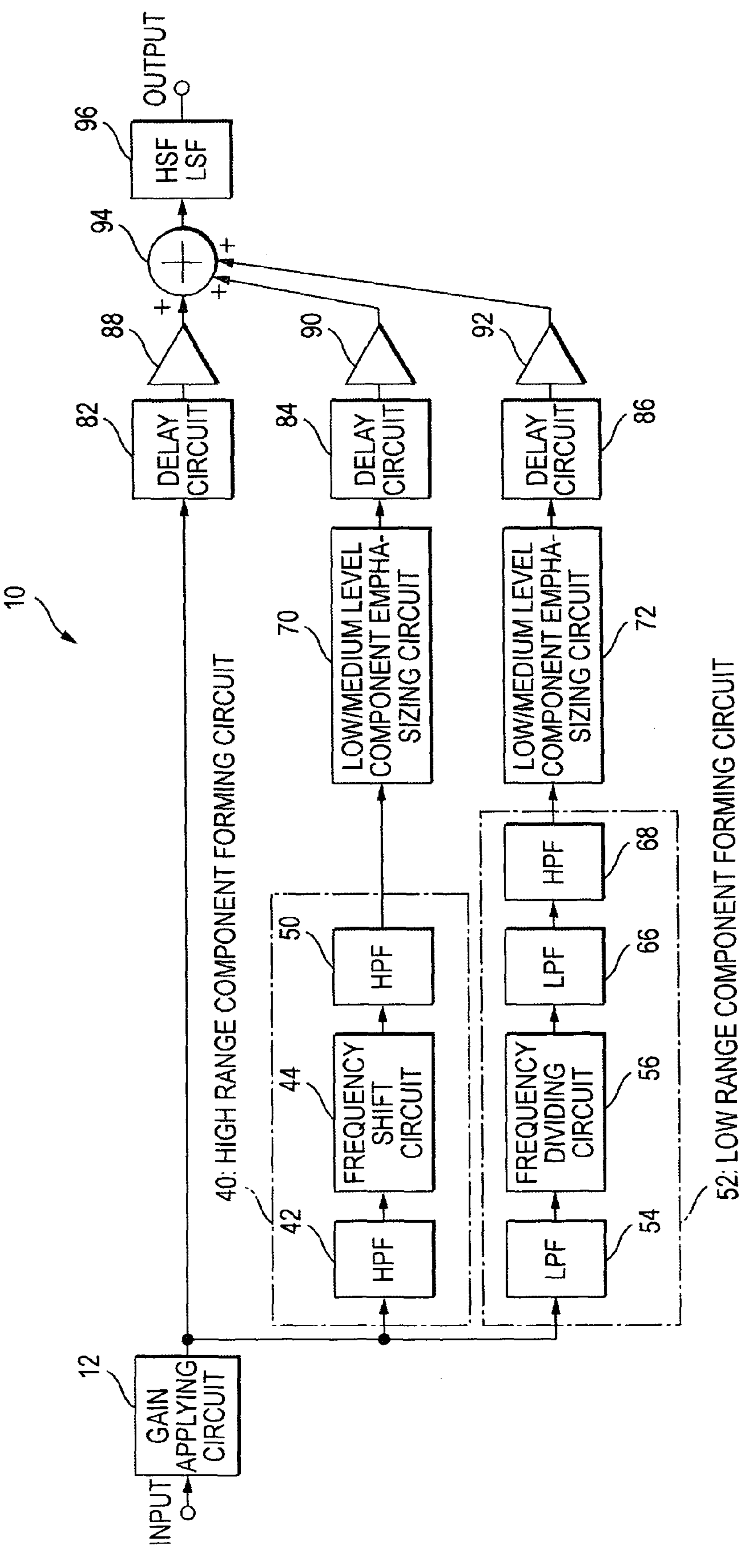
FIG. 1 is a block diagram for indicating an effect applying apparatus according to an embodiment of the present invention.

Embodiments of the present invention will now be explained. FIG. 1 indicates an embodiment of an effect adding apparatus 10 of the present invention. An audio signal of one of right and left channels audio signals (each of sample signals of digital audio signal) produced by decoding a sound source signal such as MP3 and AAC each having a high compression ratio is inputted to the effect adding apparatus 10. It should be understood that although not shown in the drawing, an audio signal of the other channel within the right and left channels is processed by a circuit having the same circuit arrangement as that of FIG. 1. A gain applying circuit 12 applies a common gain with respect to a positive side waveform portion and a negative side waveform portion of the input audio signal in response to each of input level absolute values when the input level absolute value of the positive side wave portion is larger than a predetermined value, and when the input level absolute value of the negative side wave portion is larger than this predetermined value. Also, the gain applying circuit 12 applies different gains to the positive side waveform portion and the negative side waveform portion of the input audio signal when the input level absolute value of the positive side wave portion is smaller than (, or equal to) the predetermined value, and when the input level absolute value of the negative side wave portion is smaller than (, or equal to) the predetermined value. Since the above-explained gain applying process operation is carried out, even-order harmonics which are produced in positive and negative asymmetrical waveforms are contained in the audio signals.

Figure 2:
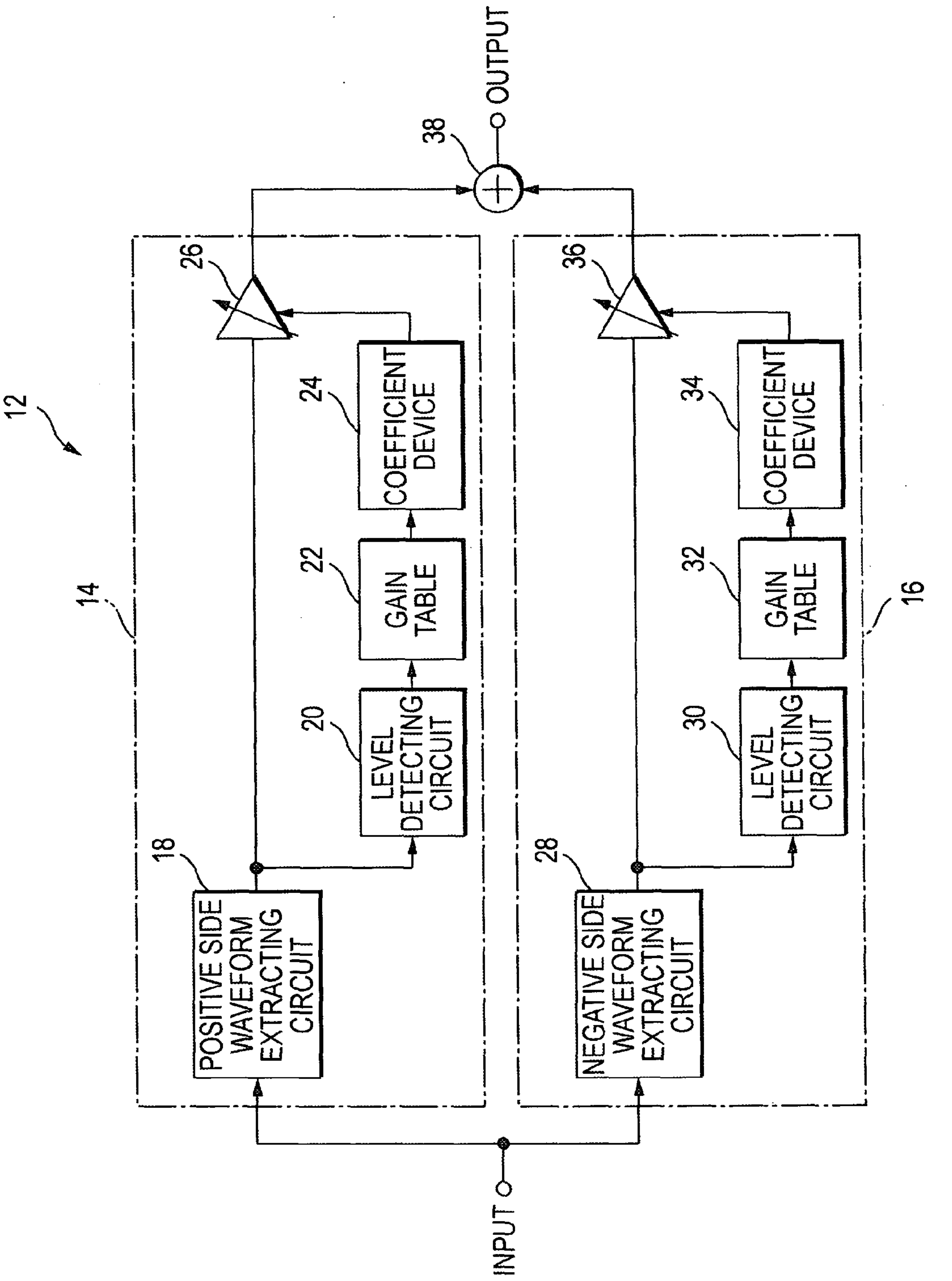
FIG. 2 is a block diagram for showing a structural example of a gain applying circuit of FIG. 1.

FIG. 2 indicates a structural of the gain applying circuit 12. An input audio signal is inputted to a positive side waveform gain applying circuit 14 and a negative side waveform gain applying circuit 16, respectively. In the positive side waveform gain applying circuit 14, a positive side waveform extracting circuit 18 extracts a waveform portion on the positive polarity side (positive side waveform portion) from the input audio signal. A level detecting circuit 20 detects a peak as to the extracted positive side waveform portion and performs a release process operation (namely, process operation for relaxing falling portion of waveform) in order that a rapid (frequent) change of a gain is suppressed and the production of unnatural sound is prevented in the gain applying process operation, and then, outputs the resultant envelope waveform as a level detection value of the positive side waveform portion.

Figure 3:
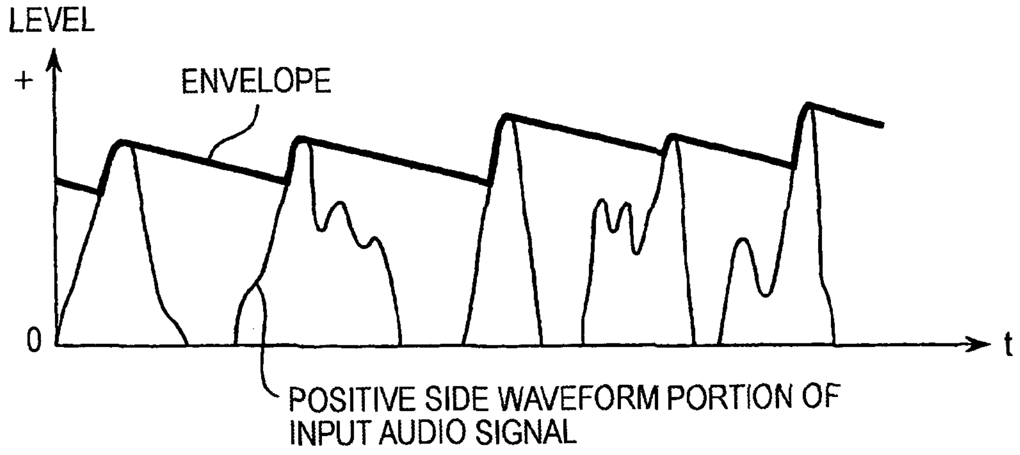
FIG. 3 is a waveform diagram for representing an operation example of a level detecting circuit of FIG. 2.

FIG. 3 represents an operation example of the level detecting circuit 20. A narrow line indicates the positive side waveform portion of the input audio signal inputted to the level detecting circuit 20. In the example of FIG. 3, while an attack time (rising time, namely time required to follow rising portion of input waveform) is set to 0 msec, and a release time (falling time, namely time required to follow falling portion of input waveform) is set to 1 msec to 10 msec, both the peak detecting operation and the release process operation are carried out, and then, the envelope waveform which is produced as a processing result and is indicated by a wide line is outputted as the level detection value of the positive side waveform portion.

Figure 4:
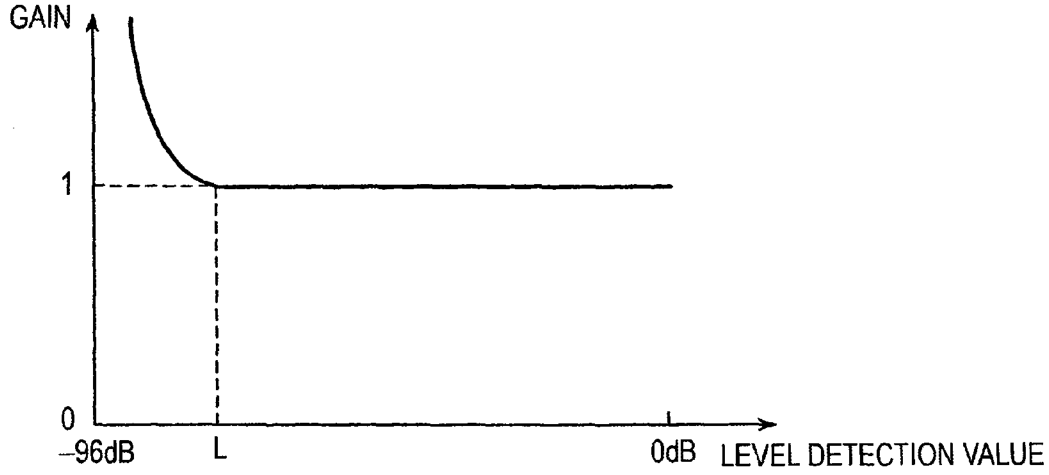
FIG. 4 is a diagram for showing an example as to a level detection value with respect to gain characteristic stored in a gain table of FIG. 2.

A gain table 22 is equipped with a memory which stores a table regarding a level detection value with respect to a gain characteristic. In response to a level detection value of the positive side waveform portion which is detected time to time by the level detecting circuit 20, a gain value corresponding to the level detection value is read out from this gain table 22 to be outputted. FIG. 4 represents one example as to the level detection value with respect to gain characteristic stored in the gain table 22. This gain characteristic corresponds to such a characteristic that when a level detection value is larger than a predetermined value "L" (value of "L" is preferably set to −80 dB to −50 dB, for example, −60 dB), the gain is fixed to "1", whereas when a level detection value is smaller than, equal to the predetermined value "L", the gain is increased in a non-linear manner in connection with such a condition the level detection value is decreased.

Figure 5:
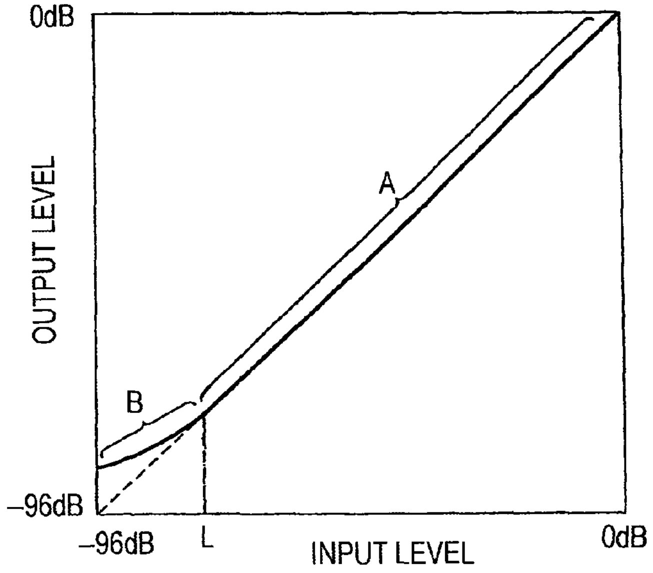
FIG. 5 is a diagram for representing an input/output level characteristic in the case that a gain is applied to an input signal by using the gain characteristic of FIG. 4.

FIG. 5 indicates an input output level characteristic in the case that a gain is applied to an input signal by using the gain characteristic of FIG. 4. This input output level characteristic corresponds to such a non-linear characteristic as an entire characteristic, which is constituted by a high level-side linear area "A", and a low level-side non-linear area "B." In the high level-side linear area "A", when an input level is larger than the above-explained predetermined value "L", an output level is changed linearly with respect to the input level. In the low level-side non-linear area "B", when an input level is smaller than, or equal to the predetermined value "L", an output level is changed in a non-linear form with respect to the input level, which is continued to an edge portion of the high level-side linear area "A" on the side of the low level (namely, output level is continuously changed in such a manner that change in output level with respect to input change becomes gradually small in connection with such a condition that input level is decreased), and then, when an input level becomes zero, an output level is not decreased to zero. The range of the non-linear area "B" is much narrower, as compared with the range of the linear area "A", and moreover, the non-linear area "B" represents a gentle curve, while being continued to the low area-side edge portion of the linear area "A." As a result, the entire gain characteristic obtained by combining the area "A" with the area "B" represents a slight non-linear characteristic, generated higher harmonics are very small, and a distortion factor is such a low level which can be hardly measured. However, the generated high harmonics become tone colors having pleasant feelings in view of a hearing sense.

In FIG. 2, a coefficient device 24 applies a proper coefficient (constant) for an adjustment purpose to an output gain value of the gain table 22. A gain of a variable gain circuit 26 (multiplier) is variably controlled in response to a gain value outputted from the coefficient device 24. The variable gain circuit 26 sequentially applies corresponding gains to corresponding portions of the positive side waveform portions extracted by the positive side waveform extracting circuit 18.

In a negative side waveform gain applying circuit 16 of FIG. 2, a negative side waveform extracting circuit 28 extracts a waveform portion (negative side waveform portion) on the side of a negative polarity from the input audio signal. A level detecting circuit 30 detects a peak and performs a release process operation as to the extracted negative side waveform portion in order that a rapid change of a gain is suppressed and the production of unnatural sounds is prevented in the gain applying process operation, and then, outputs the resultant envelope waveform as a level detection value (absolute value) of the negative side waveform portion. Both an attack time and a release time of the level detecting circuit 30 are set to the same times of the level detecting circuit 20 for the positive side. Then, the level detecting circuit 30 is operated in a similar operation example as FIG. 3, as previously explained in the level detecting circuit 20 for the positive side.

Figure 6:
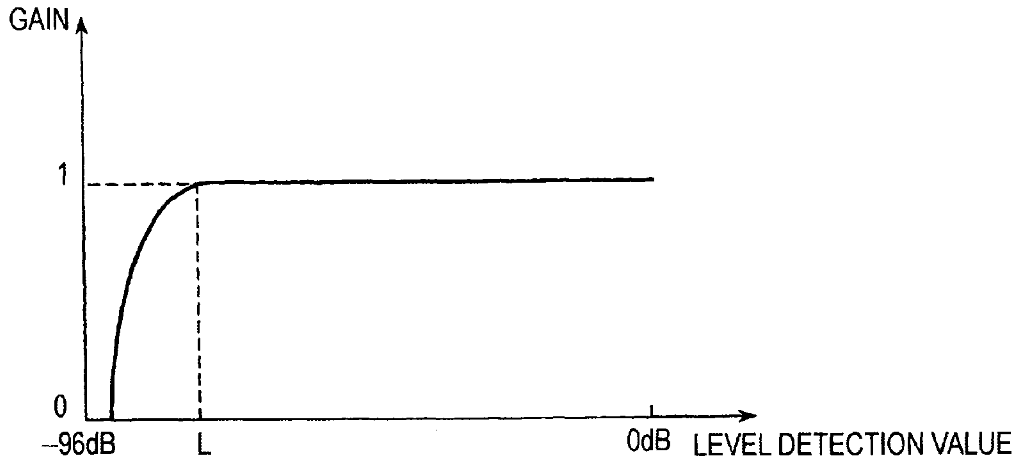
FIG. 6 is a diagram for showing an example as to a level detection value with respect to gain characteristic stored in a gain table of FIG. 2.

A gain table 32 is equipped with a memory which stores a table as to a level detection value with respect to gain characteristic. In response to a level detection value of the negative side waveform portion which is detected time to time by the level detecting circuit 30, a gain value corresponding to the level detection value is read out from this gain table 32 to be outputted. FIG. 6 represents one example as to the level detection value with respect to gain characteristic stored in the gain table 32. This gain characteristic corresponds to such a characteristic that when a level detection value (absolute value) is larger than a predetermined value "L", the gain is fixed to "1", whereas when a level detection value is smaller than, equal to the predetermined value "L", the gain is decreased in a non-linear manner in connection with such a condition that the level detection value is decreased; the gain is lowered down to 0 before the level detection value is reached to 0; and thereafter, the gain of 0 is maintained until the level detection value is reached to 0.

In FIG. 2, a coefficient device 34 applies a proper coefficient (constant) for adjustment purpose to an output gain value of the gain table 32. A gain of a variable gain circuit 36 (multiplier) is variably controlled in response to a gain value outputted from the coefficient device 34. The variable gain circuit 36 sequentially applies corresponding gains to corresponding portions of the negative side waveform portions extracted by the negative side waveform extracting circuit 28.

Figure 7:
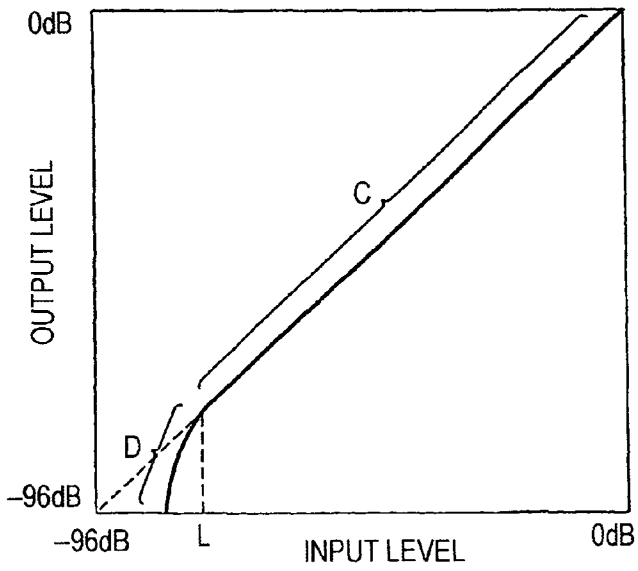
FIG. 7 is a diagram for representing an input/output level characteristic in the case that a gain is applied to an input signal by using the gain characteristic of FIG. 6.

FIG. 7 indicates an input output level characteristic in the case that a gain is applied to an input signal by using the gain characteristic of FIG. 6. This input output level characteristic corresponds to such a non-linear characteristic as an entire characteristic, which is constituted by a high level-side linear area "C", and a low level-side non-linear area "D." In the high level-side linear area "C", when an input level is larger than the above-explained predetermined value "L", an output level is changed linearly with respect to the input level. In the low level-side non-linear area "D", when an input level is smaller than, or equal to the predetermined value "L", an output level is changed in a non-linear form with respect to the input level, which is continued to an edge portion of the high level-side linear area "C" on the side of the low level (namely, output level is continuously changed in such a manner that change in output level with respect to input change becomes gradually small in connection with such a condition that input level is decreased), and such a condition that the output level is zero is maintained when the input level is changed from zero to a preselected level. The range of the non-linear area "D" is much narrower, as compared with the range of the linear area "C", and moreover, the non-linear area "D" represents a gentle curve, while being continued to the low area-side edge portion of the linear area "C." As a result, the entire gain characteristic obtained by combining the area "C" with the area "D" represents a slight non-linear characteristic, and generated higher harmonics are even-order harmonics, and also, a distortion factor is such a low level which can be hardly measured. However, the generated high harmonics become tone colors having pleasant feelings in view of a hearing sense.

Figure 8A:
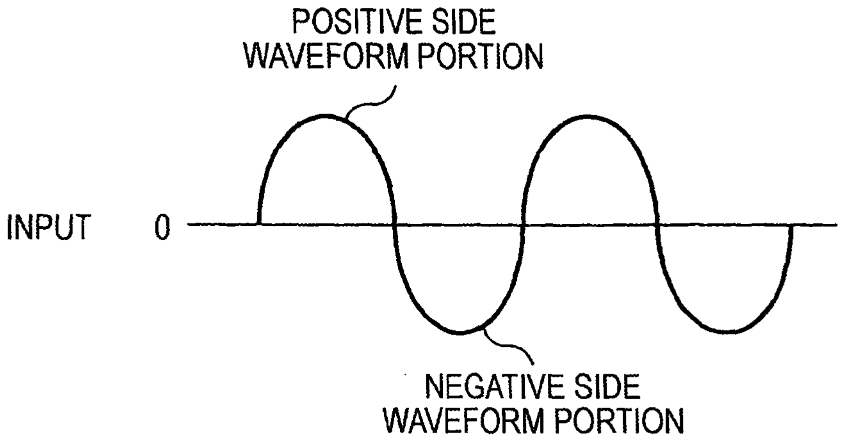
FIGS. 8A and 8B are waveform diagrams for indicating one example of input/output waveforms of the gain applying circuit of FIG. 2 by using the input/output level characteristics shown in FIGS. 5 and 7.
Figure 8B:
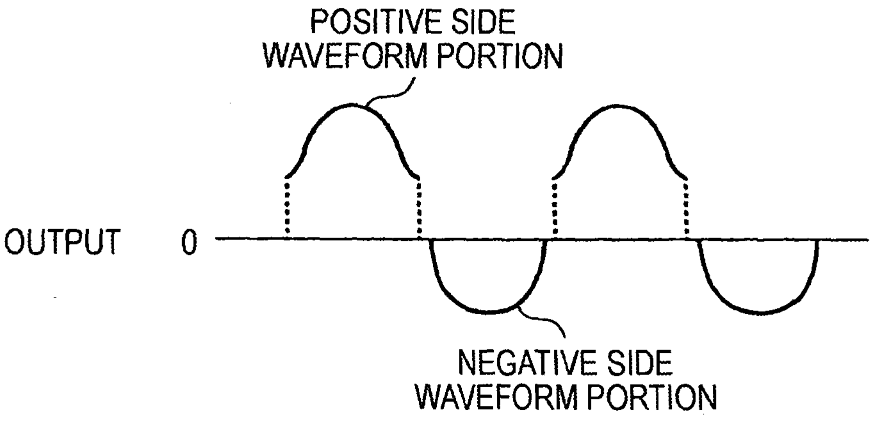

In FIG. 2, the output signal of the positive side waveform gain applying circuit 14 is added to the output signal of the negative side waveform gain applying circuit 16 so as to be synthesized with each other, so that the synthesized output signal constitutes an output signal of the gain applying circuit 12. FIGS. 8A and 8B indicate input and output waveforms of the gain applying circuit 12 shown in FIG. 2 based upon the input output level characteristic shown in FIGS. 5 and 7, as one example, a sine wave signal is inputted as an input signal. This is such a waveform when the level of the input signal is relatively low. As show in FIG. 8B, only the non-linear area "B" of FIG. 5 is used within a time period (half period of input signal) of one positive side waveform portion, and a gain is varied within the non-linear area "B." Also, only the non-linear area "D" of FIG. 7 is used within a time period (half period of input signal) of one negative side waveform portion, and a gain is varied within the non-linear area "D." At this time, as represented in FIG. 8B, a level of a peak portion of the positive side waveform portion becomes larger than a level of a peak portion of the negative side waveform portion, and also, a waveform near a zero cross point as to the positive side waveform portion is different from that as to the negative side waveform portion, so that even-order harmonics produced in positive/negative asymmetrical waveforms are contained, and thus, rich sounds may be given to the audio signal.

It should also be understood that if the non-linear areas "B" and "D" are used when a level of an input signal is high, then either unnatural sounds or sounds having distortion feelings are probably produced. However, these unnatural and distorted sounds may be prevented by the release process operations (FIG. 3) of the level detecting circuits 20 and 30 (FIG. 2). In other words, if the release process operation is carried out, then as to an input waveform having a high level, a level absolute value where a falling portion of this input waveform is relaxed in a predetermined release time maintains a high level (next large waveform is approached while level is not so lowered due to release time). As a result, only the linear areas "A" and "C" are used.

In FIG. 1, a high range component forming circuit 40 forms such an audio signal component based upon a high range component of the audio signal to which the gain is applied by the gain applying circuit 40, while the high range of this audio signal is higher than the above-explained high range component of the gain-applied audio signal (namely, such a high range higher than frequency range of gain-applied audio signal). In other words, in the high range component forming circuit 40, a high-pass filter 42 extracts a high range component which constitutes a base portion used to produce the below-mentioned audio signal component of a high range from the audio signal outputted from the gain applying circuit 12 in order that the first-mentioned audio signal component of the high range is produced by a frequency shift circuit 44 at the next stage, which is higher than the frequency range of the audio signal inputted to the high range component forming circuit 40. That frequency shift circuit 44 is employed so as to shift the high range component extracted by the high-pass filter 42 on the frequency axis.

Figure 9:
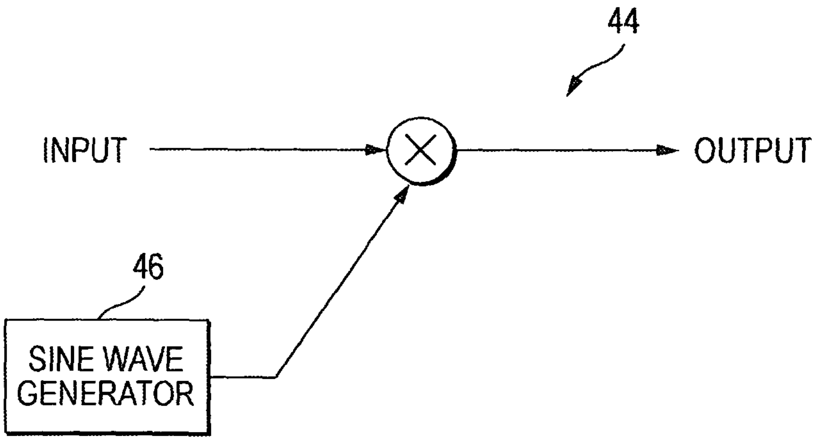
FIG. 9 is a block diagram for representing a structural example of a frequency shift circuit of FIG. 1.

FIG. 9 indicates a structural example of the frequency shift circuit 44. In the frequency shift circuit 44, the high range component extracted by the high-pass filter 42 is multiplied by a sine wave signal which has a proper frequency and is generated by a sine wave generator 46 by a multiplier 48 so as to form such a signal that the above-explained high range component is moved on the frequency axis. In other words, assuming now that the above-explained high range component is "sin A" (implies signal having various frequencies), and a sine wave signal (implies signal of sine wave shape) is "cos B" (implies signal of fixed frequency), the multiplier 48 calculates the following formula:

$$\sin A\cdot\cos B=\tfrac{1}{2}\{\sin(A+B)+\sin(A-B)\}$$

In accordance with this frequency shift calculation, such a component "sin(A−B)" that the above-explained high range component "sin A" has been shifted to the low range side is formed in addition to such a component "sin(A+B)" that the above-described high range component "sin A" has been shifted to the high range side. As a result, such a component "sin(A+B)" that the above-described high range component "sin A" has been shifted to the high range side is outputted from the high range component forming circuit 40. Since this output signal corresponds to such a component "sin(A+B)" that the above-described high range component "sin A" has been shifted to the high range side, this output signal is such a signal having a less extra distortion component known as aliasing, which is different from the case that the harmonic component of the high range component "sin A."

Figure 10A:
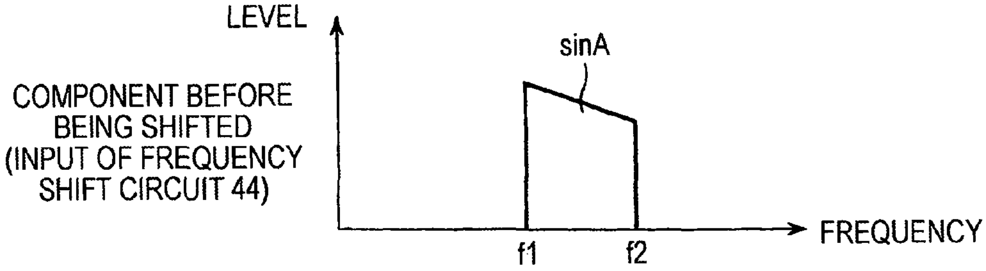
FIGS. 10A to 10C are explanatory diagrams for indicating a high range component producing stage by a high range component forming circuit of FIG. 1.
Figure 10B:
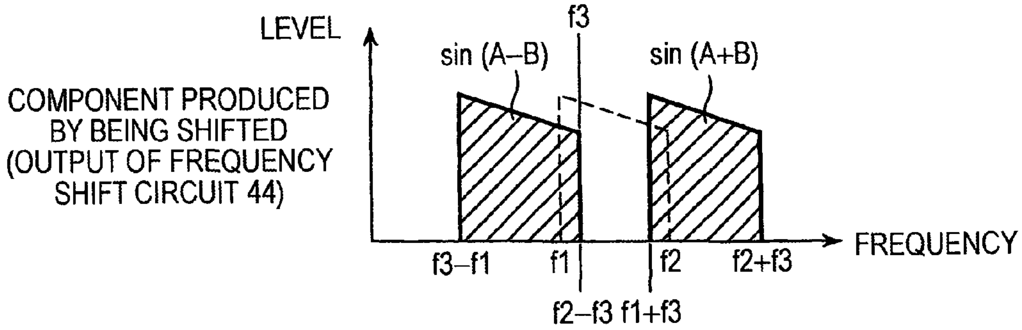
Figure 10C:
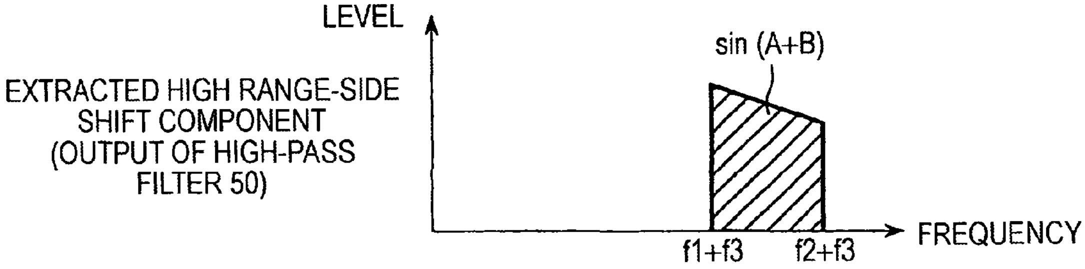

FIGS. 10A to 10C represents high range forming stages by the high range component forming circuit 40. FIG. 10A shows a high range component before a frequency shift. If this high range component is multiplied by the sine wave signal "cos B" by the multiplier 48 (FIG. 9), then both a component "sin(A+B)" shifted to the high range side and another component "sin(A−B)" shifted to the low range side are obtained as represented in FIG. 10B. These components "sin(A+B)" and "sin(A−B)" are filtered by the high-pass filter 50 so as to remove the component "sin(A−B)" shifted to the low range side, so that only the component "sin(A+B)" shifted to the high range side is outputted from the high-pass filter 50, as indicated in FIG. 10C. In other words, assuming now that an upper limit value of a frequency range of an audio signal (namely, audio signal outputted from gain applying circuit 12) which is inputted to the high-pass filter 42 is equal to "f2" (for example, 16 KHz) and a cutoff frequency of the high-pass filter 42 is equal to "f1" (f1<f2, and f1 is, for example 6 KHz), such an audio signal whose frequency range is "f1" to "f2" as shown in FIG. 10A is outputted from the high-pass filter 42. Also, assuming now that the frequency of the sine wave signal generated from the sine wave generator 46 (FIG. 9) is equal to "f3" (for example, 8 KHz), as represented in FIG. 10B, both an audio signal whose frequency range is (f1+f3) to (f2+f3) is outputted as the component "sin(A+B)" shifted to the high range side, and another audio signal whose frequency range is (f3−f1) to (f2−f3) is outputted as the component "sin(A−B)" shifted to the low range side are outputted from the frequency shift circuit 44 having the arrangement of FIG. 9, respectively. It should also be understood that the example of FIG. 10B indicates such a case that f1=6 KHz, f2=16 KHz, and f3=8 KHz, i.e., a relationship is given by chance: f2−f3=f3. Assuming now that the cutoff frequency of the high-pass filter 50 is f4{(f2−f3)≦f4≦(f1+f3), and f4 is, for example, 10 KHz}, such a signal whose frequency range is (f1+f3) to (f2+f3) as represented in FIG. 10C is outputted from the high-pass filter 50.

In FIG. 1, a low range component forming circuit 52 forms an audio signal component of a low range based upon the low range component of the audio signal to which the gain is applied by the gain applying circuit 12, while the above-explained low range is lower than the low range component of this gain-applied audio signal. In other words, in the low range component forming circuit 52, in order that the audio signal component having the low range which is lower than the frequency range of the audio signal inputted to the low range component forming circuit 52 is formed in a frequency dividing circuit 56 of the next stage, a low-pass filter 54 extracts such a low range component which constitutes a base component by which the audio signal component having the low range is formed from the audio signal outputted from the gain applying circuit 12. A cutoff frequency of the low-pass filter 54 is set to, for example, 100 Hz. The frequency dividing circuit 56 forms such an audio signal component having a ½ frequency as to the frequency of the low range portion extracted by the low-pass filter 54, while the ½ frequency thereof is equal to a frequency lower than that of the low range portion by 1 octave.

Figure 11:
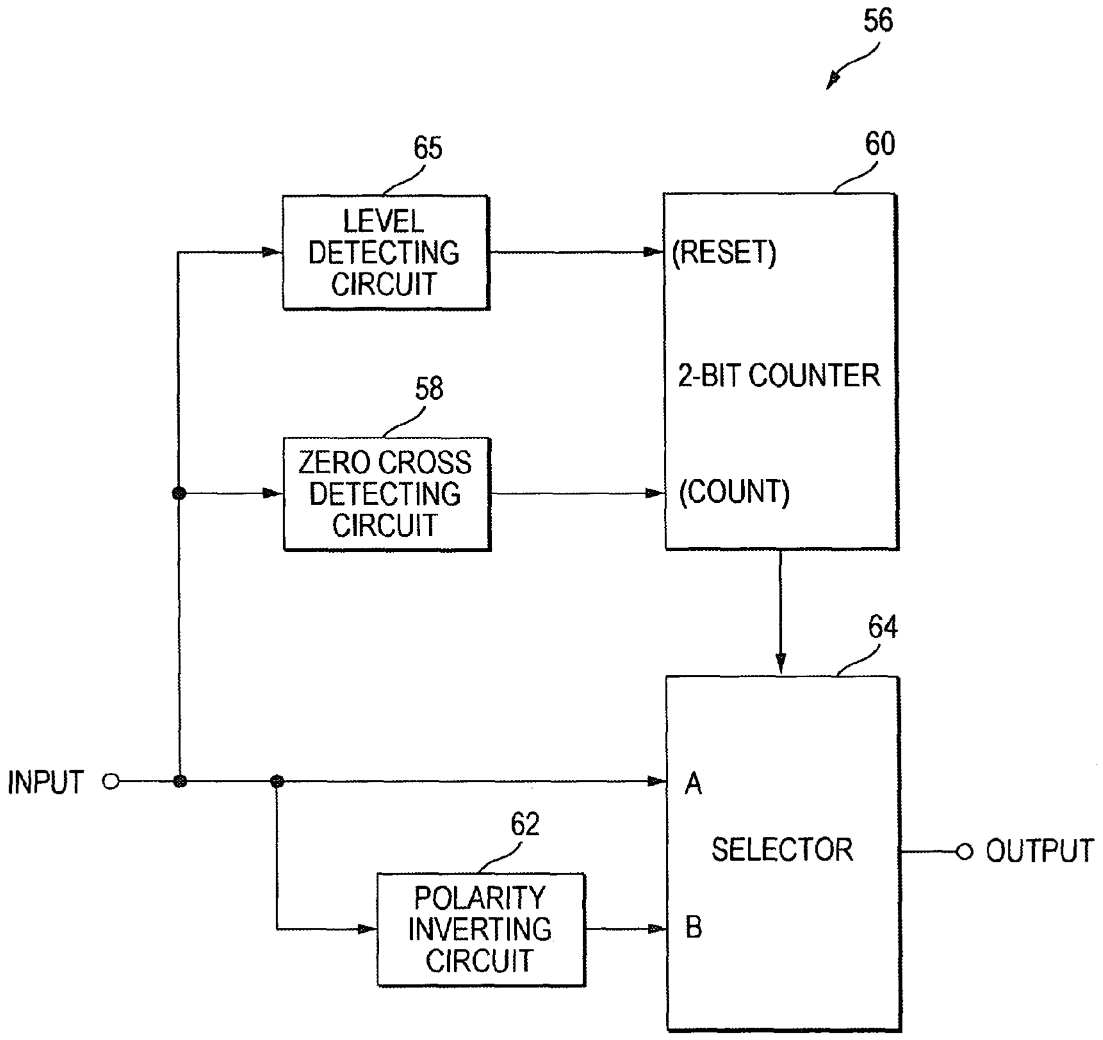
FIG. 11 is a block diagram for indicating a structural example of a frequency dividing circuit.

FIG. 11 is a structural example of the frequency dividing circuit 56. This frequency dividing circuit 56 detects zero crosses of an input signal entered to the own frequency dividing circuit 56, and is used to form a signal having a ½ time period as to a time period of a basic wave component in such a manner that 4 continued sections (namely, 2 time periods of basic wave component) which are sectioned by these detected zero crosses are employed as 1 unit, and polarities of waveforms as to 2 continued sections among these 4 sections are inverted. That is to say, in the frequency dividing circuit 56, the zero cross detecting circuit 58 detects the zero crosses of the input signal. A zero cross may be judged based upon data as to a sign bit of each of sample data which constitute the above-explained input signal. A 2-bit counter 60 counts the detected zero crosses to output count values of 0 to 3 in a circulated manner. The frequency dividing circuit 56 judges that the relevant zero cross is presently located in which section among the above-described 4 sections based upon the count value. A polarity inverting circuit 62 inverts a polarity of an input signal. A selector 64 inputs the input signal to an A input thereof and the inverted signal of the input signal to a B input thereof. Then, when the count values are equal to 0 and 3, the selector 64 selects the A input to output the input signal, whereas when the count values are equal to 1 and 2, the selector 64 selects the B input to output the inverted signal. As a result, such a signal having a ½ time period as to the time period of the basic wave component of the input signal for the frequency dividing circuit 56 is outputted from the selector 64.

It should also be understood that since it is preferable not to execute the above-explained frequency dividing operation as to a very small low range portion of an input signal inputted to the frequency dividing circuit 16, this frequency dividing operation is stopped. In other words, in FIG. 11, the level detecting circuit 65 performs both a peak detecting operation and a release processing operation as to an input signal (either positive side waveform portion or negative side waveform portion of input signal, or full-wave rectified waveform) of the frequency dividing circuit 56, and detects a level from an envelope signal produced from the process results. When the detected level is lower than, or equal to a predetermined level (for example, lower than, or equal to −80 dB), the level detecting circuit 65 outputs a reset signal so as to reset the 2-bit counter 60. As a result, the 2-bit counter 60 continuously outputs the count value of "0" for a time period during which the level of the input signal level becomes lower than, or equal to the predetermined level, and the selector 64 continuously selects and outputs the input signal of the A input, namely, the not-inverted input signal.

Figure 12A:
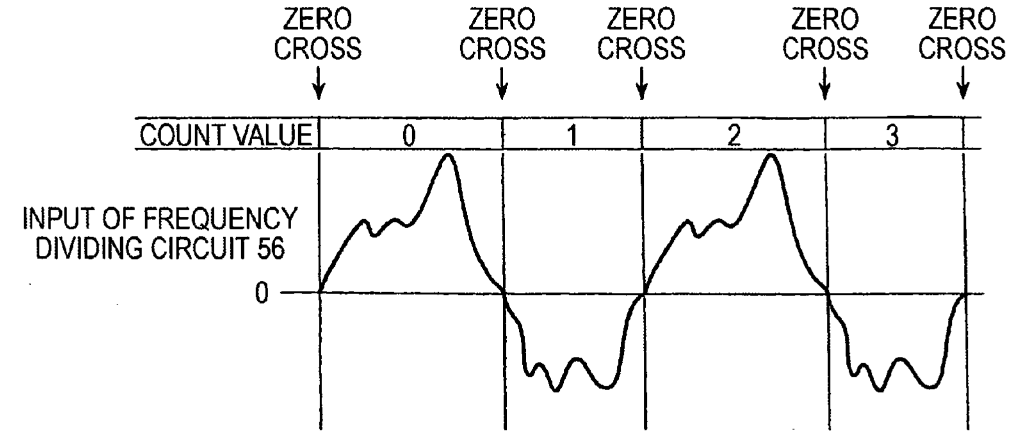
FIGS. 12A and 12B are operation waveform diagrams for showing the frequency dividing circuit of FIG. 11.
Figure 12B:
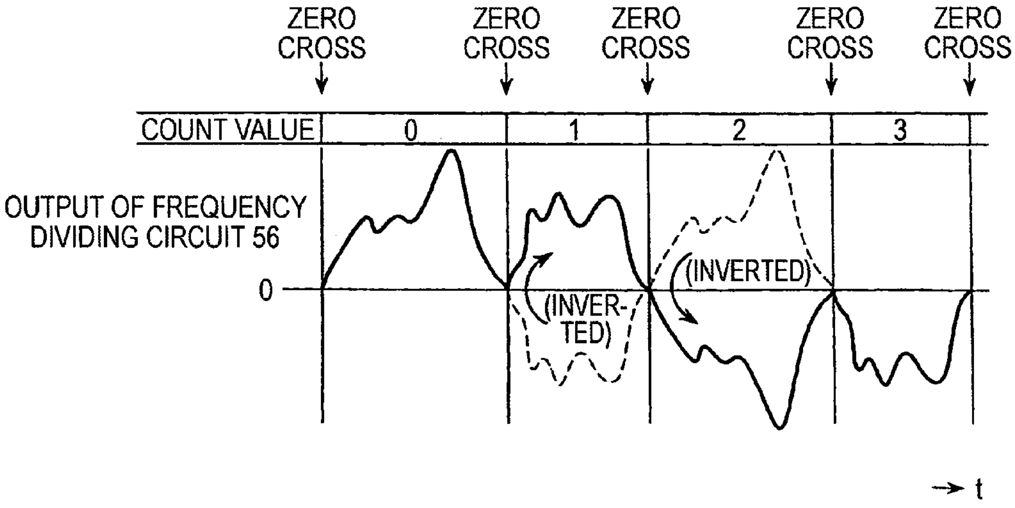

FIGS. 12A to 12C indicate operating waveforms of the frequency dividing circuit 56 of FIG. 11. The frequency dividing circuit 56 detects zero crosses as to an input signal shown in FIG. 12A, and while 4 continued sections 0 to 3 are employed as 1 unit which are sectioned by the detected zero crosses, the frequency dividing circuit 56 inverts polarities of waveforms as to the sections 1 and 2 among these 4 sections as represented in FIG. 12B so as to form a signal having a ½ time period with respect to the time period of the basic waveform component, and repeats this operation.

In FIG. 1, the output signal of the frequency dividing circuit 56 is filtered by a low-pass filter 66, and is further filtered by a high-pass filter 68. In other words, in accordance with the above-explained process operation of the frequency dividing circuit 56, discontinued points are produced in the waveforms in connection with the waveform inverting operation, and then, the discontinued points newly produce harmonic components. As a result, the harmonic components are removed by the low-pass filter 66. A cutoff frequency of the low-pass filter 66 is set to be higher than the cut frequency of the low-pass filter 54 provided on the input side of the frequency dividing circuit 56, for instance, set to 150 Hz. Also, in accordance with the above-described process operation of the frequency dividing circuit 56, there are some cases that the output signal of this frequency dividing circuit 56 contains ultra-low components (sub-sonic components) which may give unpleasant acoustic feelings. As a consequence, the ultra-low components are removed by the high-pass filter 68. A cutoff frequency of the high-pass filter 68 is set to, for example, 50 Hz.

In FIG. 1, both the output signal from the high range component forming circuit 40 and the output signal from the low range component forming circuit 52 are inputted to low/medium level component emphasizing circuits 70 and 72 respectively, so that low level components to medium level components of these output signals are emphasized. As a consequence, the high range components formed by the high range component forming circuit 40 and the low range components formed by the low range component forming circuit 52 are emphasized respectively, so that effects obtained by adding the high range component and the low range component can be readily recognized, while these effects cover extension and gorgeousness of the high range and dynamism and vitality of low tones.

Figure 13:
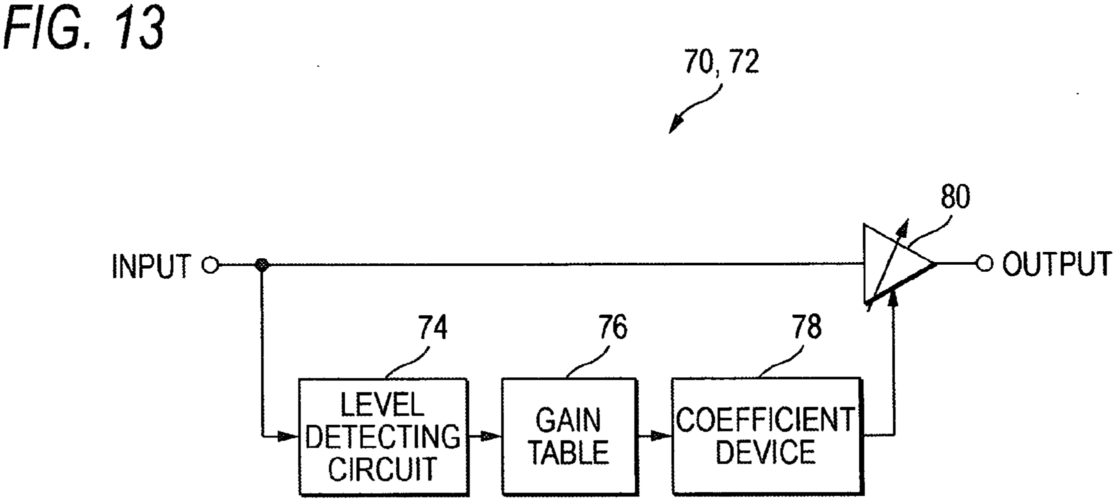
FIG. 13 is a block diagram for indicating an example as to arrangements of low/medium level component emphasizing circuits of FIG. 1.

FIG. 13 indicates a structural example as to the low/medium level component emphasizing circuits 70, or 72. A level detecting circuit of FIG. 13 is arranged in a similar manner to that of the positive side waveform gain applying circuit 14 and the negative side waveform gain applying circuit 16 of FIG. 2. In other words, in order that the level detecting circuit 74 suppresses a rapid change in a gain and prevents a production of unnatural sounds, the level detecting circuit 74 performs both a peak detecting operation and a release process operation with respect to the input signals (either positive side waveform portions or negative side waveform portions of input signals, or full-rectified waveform) of the low/medium level component emphasizing circuits 70 and 72, and then, outputs envelope waveforms produced by performing these peak detecting/release processing operations as level detection values. The level detecting circuit 74 may set, for example, an attack time as 0 msec, and release times as 0.1 to 1 second.

Figure 14:
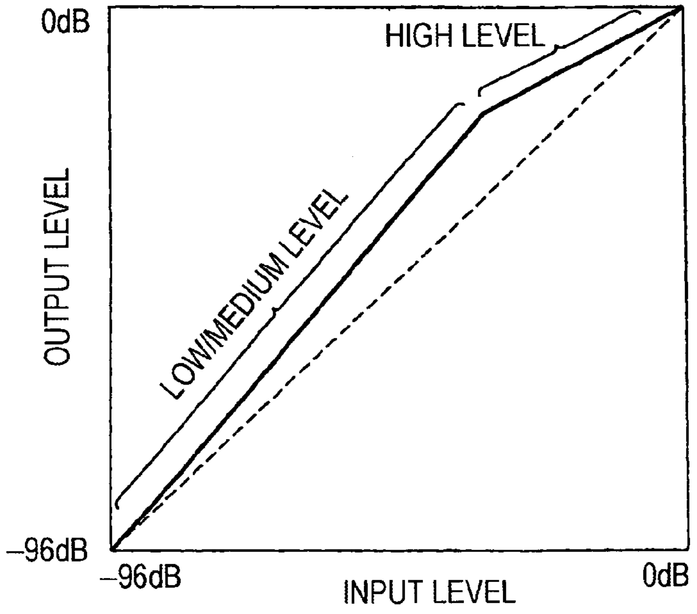
FIG. 14 is a diagram for showing one example of an input/output level characteristic based upon a table of a level detection value with respect to gain characteristic provided in a gain table of FIG. 13.

A gain table 76 is equipped with a memory which stores a table as to a level detection value with respect to gain characteristic. In response to a level detection value which is detected time to time by the level detecting circuit 74, a gain value corresponding to the level detection value is read out from this gain table 76 to be outputted. FIG. 14 represents one example as to an input/output level characteristic by this gain table 76 by using a solid line (dot line shows linear characteristic in case that gain is not applied). The input/output level characteristic of FIG. 14 corresponds to such a characteristic that low and medium level components are expanded; a high level component is compressed; and signal levels of the low and medium level components are relatively increased without changing a dynamic range as an overall characteristic.

In FIG. 13, a coefficient device 78 applies a proper coefficient (constant) for an adjustment purpose to an output gain value of the gain table 76. A gain of a variable gain circuit 80 (multiplier) is variably controlled in response to a gain value outputted from the coefficient device 78. The variable gain circuit 80 sequentially applies corresponding gains to corresponding portions of the input signals of the low/medium level component emphasizing circuits 70 and 72 so as to emphasize the signal levels of the low/medium level components.

In FIG. 1, delay circuits 82, 84, 86 individually delay the output signal of the gain applying circuit 12, the high range portion outputted from the low/medium level component emphasizing circuit 70, and the low range portion outputted from the low/medium level emphasizing circuit 72, if necessary, in order to change a trend of a sound quality. That is to say, for instance, if a delay time of the delay circuit 84 is set to "0" and delay times of the delay circuits 82 and 86 are set to several milliseconds, then the high range component is quickly reached to a listener, and the acoustic recognition of the high range portion is supported. As a result, such a sound that a rising portion of the high range portion becomes sharp may be produced. Also, if the delay time of the delay circuit 86 is set to "0" and the delay times of the delay circuits 82 and 84 are set to several milliseconds, then the low range component is quickly reached to the listener. As a result, such a sound that a rising portion of a low tone is modulated for effects, and the low tone is tightened. While several sorts of combinations as to these delay times of the delay circuits 82, 84, 86 have been previously set, if an arbitrary combination of these delay times may be selected based upon own desirable feelings of the listener, then convenience of sound selections may be established. Alternatively, the listener may individually adjust the delay times of the delay circuits 82, 84, and 86.

The level balance of the signals which have been properly delayed by the delay circuits 82, 84, 86 are naturally adjusted at gain correction circuits 88, 90, 92, and thereafter, the level-adjusted signals are added to each other by an adder 94 to be synthesized with each other. A balance between the high range and the low range of the added and synthesized signal is finally adjusted by a so-called "tone control circuit" which is constituted by a high shaving filter and low shaving filter 96, and then, the finally balance-adjusted signal is outputted. The outputted signal is converted by a digital-to-analog converting operation, and then, the D/A-converted analog signal is amplified by a power amplifier to be played back by a speaker (not shown).

In the above-explained embodiment, the gain applying circuit 12 (FIG. 2) applies the gains to the positive side waveform portion and the negative side waveform portion of the audio signal so that the non-linear input/output level characteristics (see FIG. 5 and FIG. 7) different from each other are obtained. Alternatively, the gain applying circuit 12 may apply a gain to any one of the positive side waveform portion and the negative side waveform portion of the audio signal so that a non-linear input/output level characteristic (for example, characteristic shown in FIG. 5, or FIG. 7) may be achieved, whereas the gain applying circuit 12 may apply a gain to the other waveform portion so that a linear input/output level characteristic may be achieved. Even if such an alternative gain application method is employed, then asymmetrical waveforms may be obtained in both the positive side waveform portion and the negative side waveform portion, and even-order harmonics may be contained in an output signal produced by adding these asymmetrical waveform signals to each other.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2005-376400 filed on Dec. 27, 2005, the contents of which are incorporated herein for reference.

What is claimed is:

1. An effect adding method, comprising:

applying different gains to a positive side waveform portion and a negative side waveform portion of an audio signal respectively when absolute values of input levels of the positive side waveform portion and the negative side waveform portion are smaller than a predetermined value;

producing a higher range component of the audio signal based on a high range component of the audio signal to which the gain is applied, the higher range component being higher in frequency than the high range component;

producing a lower range component of the audio signal based on a low range component of the audio signal to which the gain is applied, the lower range component being lower in the frequency than the low range component; and synthesizing an audio signal having an effect sound by adding the audio signal to which the different gains are applied, the higher range component, and the lower range component with each other.

2. The effect adding method according to claim 1, wherein when the absolute values of the input levels of the positive side waveform portion and the negative side waveform portion are larger than the predetermined value, a common gain is applied to the positive side waveform portion and the negative side waveform portion respectively in the applying process.

3. The effect adding method according to claim 1, wherein the gain with respect to the positive side waveform portion is applied to the absolute value of the input level of the positive side waveform portion which is processed by relaxing a falling portion of an input waveform of the positive side waveform portion by a predetermined release time; and wherein the gain with respect to the negative side waveform portion is applied to the absolute value of the input level of the negative side waveform portion which is processed by relaxing a falling portion of an input waveform of the negative side waveform portion by the predetermined release time.

4. The effect adding method according to claim 1, wherein an input/output level characteristic of one of the positive side and negative side waveform portions with respect to the gain, includes:

a high level-side linear area in which the level characteristic is formed so that an output level is changed in a linear manner with respect to the input level when the absolute value of the input level is larger than the predetermined value; and a low level-side non-linear area in which the level characteristic is formed so that the output level is changed in a non-linear manner with respect to the input level when the absolute value of the input level is smaller than the predetermined value while being continued to an edge portion of the level characteristic in the high level-side linear area, and is formed so that the output level is not lowered to zero when the input level is zero; and wherein the input/output level characteristic of the other of the positive side and negative side waveform portions with respect to the gain, includes:

a high level-side linear area in which the level characteristic is same as the level characteristic in the high level-side liner area with respect to the one of the positive side and negative side waveform portions; and a low level-side non-linear area in which the level characteristic is formed so that the output level is changed in the non-linear manner with respect to the input level when the absolute value of the input level is smaller than or equal to the predetermined value while being continued to the edge portion of the level characteristic in the high level-side linear area, and is formed so that the output level is kept zero when the input level is in a range from zero to a predetermined level.

5. The effect adding method according to claim 1, wherein in the producing process of the higher range component of the audio signal, the high range component of the audio signal to which the gain is applied is extracted, the extracted high range portion is multiplied by a sine wave signal having a predetermined frequency, and within a low range-side shift component and a high range-side shift component, which are produced by the multiplication, the low range-side shift component is removed so as to obtain the remaining high range-side shift component as the higher range component of the audio signal.

6. The effect adding method according to claim 1, further comprising:

compressing a high level portion of the higher range component relative to low and medium level portions of the higher range component so as to relatively increase signal levels of the low and medium level portions with respect to that of the high level portion after the producing process of the higher range component; and compressing a high level portion of the lower range component relative to low and medium level portions of the lower range component so as to relatively increase signal levels of the low and medium level portions with respect to that of the high level portion after the producing process of the lower range component, wherein in the synthesizing process of the audio signal, the compressed higher range component and the compressed lower range component are added to the audio signal to which the gain is applied.

7. The effect adding method according to claim 1, wherein in the synthesizing process of the audio signal, the audio signal to which the different gains are applied, the higher range component, and the lower range component are added to each other after time sequences of the audio signal, the higher range component, and the lower range component are adjusted.

8. An effect adding apparatus comprising:

a gain applying unit that applies different gains to a positive side waveform portion and a negative side waveform portion of an audio signal respectively when absolute values of input levels of the positive side waveform portion and the negative side waveform portion are smaller than or equal to a predetermined value;

a first producing unit that produces a higher range component of the audio signal based on a high range component of the audio signal to which the gain is applied, the higher range component being higher in frequency than the high range component;

a second producing unit that produces a lower range component of the audio signal based on a low range component of the audio signal to which the gain is applied, the lower range component being lower in the frequency than the low range component; and a synthesizing unit that synthesizes an audio signal having an effect sound by adding the audio signal to which the different gains are applied, the higher range component, and the lower range component with each other.

9. The effect adding apparatus according to claim 8, wherein when the absolute values of the input levels of the positive side waveform portion and the negative side waveform portion are larger than the predetermined value, the gain applying unit applies a common gain to the positive side waveform portion and the negative side waveform portion respectively in the applying process.

* * * * *